(12) United States Patent  
Dailey et al.

(10) Patent No.: US 9,417,664 B1
(45) Date of Patent: *Aug. 16, 2016

(54) RACK POWER AND DATA BUS

(71) Applicant: Google Inc., Mountain View, CA (US)

(72) Inventors: William Leslie Dailey, Redwood City, CA (US); Angela Ying-Ju Chen, San Francisco, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/612,634

(22) Filed: Feb. 3, 2015

Related U.S. Application Data

(63) Continuation of application No. 13/444,318, filed on Apr. 11, 2012, now Pat. No. 8,964,396.

(51) Int. Cl.
*H05K 7/14* (2006.01)
*H05K 5/02* (2006.01)
*G06F 1/16* (2006.01)
*H02B 1/21* (2006.01)

(52) U.S. Cl.
CPC ............ *G06F 1/1683* (2013.01); *H02B 1/21* (2013.01); *H05K 7/1454* (2013.01); *H05K 7/1492* (2013.01)

(58) Field of Classification Search
CPC ..... G06F 1/183; H05K 7/1454; H05K 7/1492
See application file for complete search history.

(56) References Cited

U.S. PATENT DOCUMENTS

| 4,179,724 | A |   | 12/1979 | Bonhomme |   |
|---|---|---|---|---|---|
| 4,327,835 | A | * | 5/1982 | Leger | H05K 7/1425 211/41.17 |
| 5,483,419 | A | * | 1/1996 | Kaczeus, Sr. | G06F 13/4081 312/274 |
| 5,687,063 | A |   | 11/1997 | Chabert |   |
| 5,823,815 | A | * | 10/1998 | Takata | H01R 13/6315 439/248 |
| 5,966,292 | A |   | 10/1999 | Amberg et al. |   |
| 6,421,252 | B1 | * | 7/2002 | White | H05K 7/1429 174/377 |
| 6,496,364 | B1 |   | 12/2002 | Medin et al. |   |
| 6,549,400 | B1 |   | 4/2003 | Kayser et al. |   |
| 6,636,428 | B2 | * | 10/2003 | Follmer | G06F 1/184 174/359 |
| 6,711,012 | B1 |   | 3/2004 | Medin et al. |   |
| 6,840,815 | B2 | * | 1/2005 | Musolf | H04Q 1/021 439/668 |

(Continued)

FOREIGN PATENT DOCUMENTS

WO     2012113807 A1    8/2012

OTHER PUBLICATIONS

"Power 34", http://www.methode.com/about/case-studies/power34.html, retrieved from the internet on Dec. 3, 2010, 1 page.

*Primary Examiner* — Robert J Hoffberg
(74) *Attorney, Agent, or Firm* — Lerner, David, Littenberg, Krumholz & Mentlik, LLP

(57) ABSTRACT

Aspects of the disclosure relate generally to relates server rack architecture for housing computing components on a plurality of shelves. More specifically, the shelves of a particular rack may each include a power and data bus ("PDB") pre-configured to support a particular number of devices of the shelf. A PDB may also include a number of power and data connections for blind mating with the devices of the shelf. The PDB may include two blades which extend away from the PDB and blind mate with the main bus bar. Thus, each PDB may route both power and data signals between a main bus bar for the rack and each of the devices of the shelf. A shelf may be reconfigured for a different number of devices by changing the configuration of the PDB.

20 Claims, 12 Drawing Sheets

(56) References Cited

U.S. PATENT DOCUMENTS

| | | | |
|---|---|---|---|
| 6,927,974 B2 | 8/2005 | Robillard et al. | |
| 7,365,964 B2 | 4/2008 | Donahue, IV | |
| 7,414,856 B2* | 8/2008 | Sandgren | H05K 7/1461 361/727 |
| 7,489,522 B2* | 2/2009 | Hoshino | H05K 7/1418 174/520 |
| 7,525,809 B2* | 4/2009 | Bergmann | H01R 25/006 361/752 |
| 7,684,208 B2* | 3/2010 | Okamoto | H05K 7/1487 361/754 |
| 8,047,383 B2* | 11/2011 | Hendrix | H05K 7/1418 211/26 |
| 8,054,645 B2* | 11/2011 | Ikeda | H05K 7/1461 361/802 |
| 8,164,906 B2* | 4/2012 | Franco | G06F 1/183 361/727 |
| 8,351,192 B2 | 1/2013 | Archibald et al. | |
| 8,475,214 B2 | 7/2013 | Shtargot et al. | |
| 8,482,925 B2* | 7/2013 | Yang | G06F 1/183 248/295.11 |
| 8,582,302 B2 | 11/2013 | Peterson et al. | |
| 8,797,736 B2* | 8/2014 | Zhu | G06F 1/187 174/535 |
| 8,964,396 B1* | 2/2015 | Dailey | 312/223.2 |
| 2007/0119792 A1* | 5/2007 | Hendrix | H05K 7/1418 211/26 |
| 2008/0239649 A1 | 10/2008 | Bradicich et al. | |
| 2008/0244052 A1* | 10/2008 | Bradicich | G06F 1/183 709/223 |
| 2012/0224313 A1* | 9/2012 | Hu | H05K 7/1489 361/679.4 |

* cited by examiner

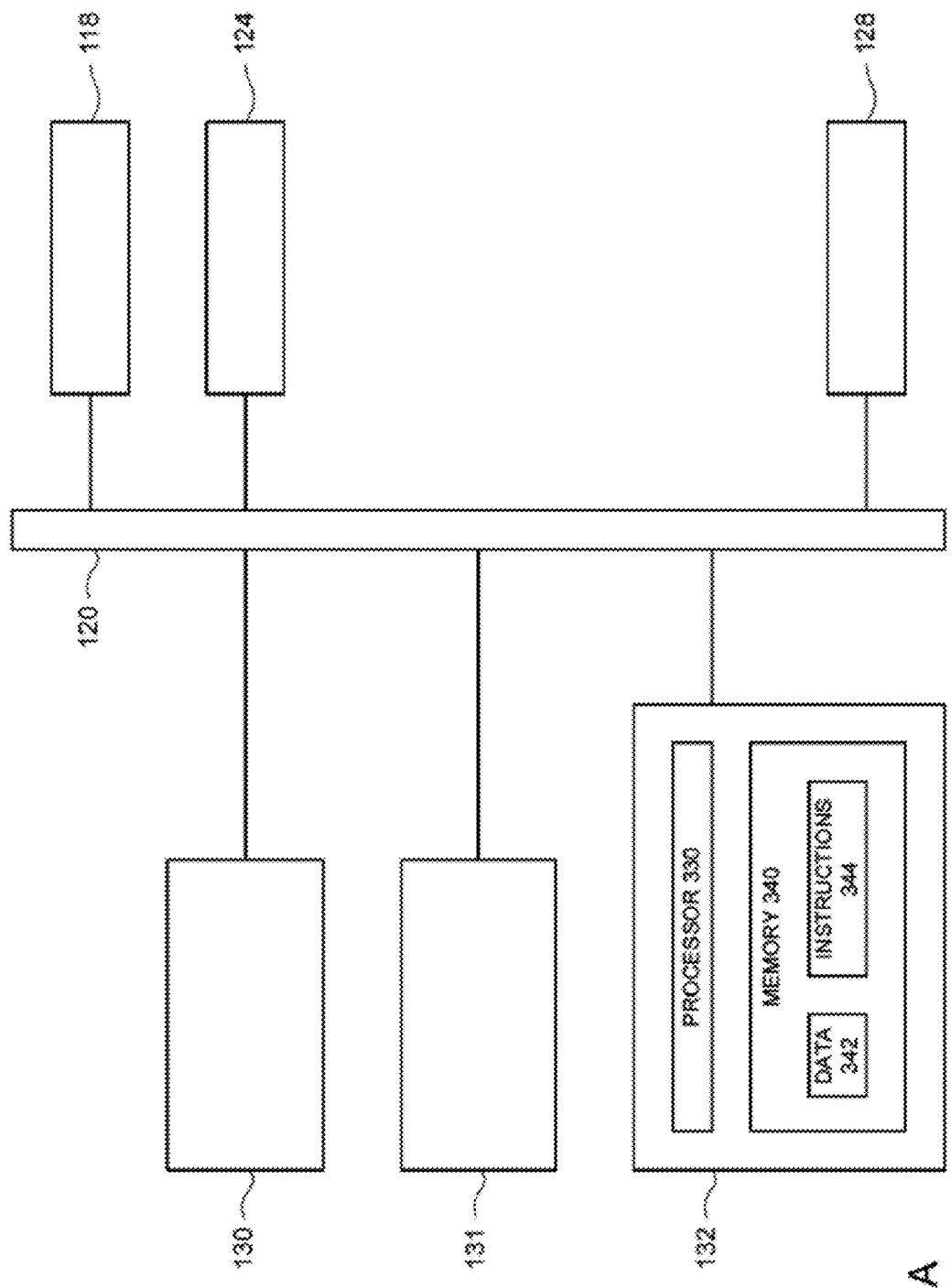

RACK POWER AND DATA BUS

CROSS-REFERENCE TO RELATED APPLICATIONS

The present application is a continuation of U.S. patent application Ser. No. 13/444,318, filed Apr. 11, 2012, now U.S. Pat. No. 8,964,396, issued on Feb. 25, 2015, the disclosure of which is incorporated herein by reference.

BACKGROUND

Corporations operating large-scale computing systems invest significant amounts of capital to establish and maintain the hardware necessary to house the computing systems. For example, some computing systems may include a plurality of racks for holding computing components such as hard drives or entire servers. These racks are typically very expensive to purchase and come in a few standardized sizes.

Typically, power and data are routed to the computing devices via cables. For example, a cable connected to a printed control board (PCB) at one end and a computing component at the other end may transfer power from the PCB to the computing component. The greater the number of computing devices in a rack, the greater the number of cables required to be routed between the PCB and the computing components. Having a large number of cables can be costly in terms of space and accessibility to the computing components and the rack itself.

SUMMARY

One aspect of the disclosure provides a kit adapted for assembly into a plurality of different rack configurations for housing one or more computing devices. The kit includes a rack, a main bus bar that provides power to the one or more devices, and a plurality of interchangeable shelves. The plurality of interchangeable shelves includes a first shelf configured to receive the one or more devices. The first shelf has a first power and data bus (PDB) being configured to mate with the main bus bar when the first shelf is placed in the rack. The first PDB also has a set of blind mating connections.

In one example, the first PDB includes a blade for mating with the main bus bar when the first shelf is placed in the rack. In this example, the blade is mounted to the first PDB at a right angle to a surface of the first PDB. In another example, the first shelf includes one or more bays configured to assist in the placement of a device onto the first shelf when the first shelf is placed in the rack. In yet another example, the first PDB is configured to mate with at least one uninterruptable power supply unit such that power flows between the main bus bar and the uninterruptable power supply unit when the rack is powered. In a further example, the rack includes a first side wall having a first inner surface, a first end, and a second end opposite of the second end; the main bus bar is located at the second end of the rack adjacent to the first inner surface, the main bus bar; and the first shelf has a first end, a second end opposite of the first end, and the first power and data bus (PDB) is located at the second end of the first shelf. In this example, the first PDB is configured to mate with the main bus bar when the first shelf is placed in the rack such that the first end of the first shelf is oriented towards the first end of the rack and the second end of the first shelf is oriented towards the second end of the rack. In another example, the first shelf has a first number of bays for receiving the one or more devices, the set of blind mating connections corresponding to the first number of bays. In this example, the plurality of shelves further comprises a second shelf having a second number of bays for receiving the one or more devices different from the first number of bays. In yet another example, the plurality of shelves further comprises a second shelf second shelf having a first end, a second end opposite of the first end, and a second bus bar at the second end of the first shelf, the second bus bar being configured to mate with the main bus bar when the second shelf is placed in the rack such that the first end of the second shelf is oriented towards the first end of the rack and the second end of the second shelf is oriented towards the second end of the rack.

Another aspect of the disclosure provides a rack assembly for housing and providing power to one or more devices. The rack assembly includes a rack, a main bus, and a shelf having a power and data bus (PDB). The PDB is configured to blind mate with the main bus bar to allow the power and data to flow between the PDB and the main bus bar when the shelf is placed in the rack, the PDB including a set of blind mating connections for mating with at least one of the one or more computing devices.

In one example, the PDB further includes a blade for mating with the main bus bar when the shelf is placed in the rack. In this example, the blade is mounted to the PDB in a plane parallel to a surface of the PDB. In another example, the shelf includes at least one barrier that divides the shelf into bays for receiving the one or more devices. In this example, a number of the bays corresponds to a number of blind mating connections of the PDB. In addition, the bays of the shelf are configured to assist in the placement of a device onto the shelf when the shelf is placed in the rack. In yet another example, the one or more devices includes a computing component. In a further example, the one or more devices includes an uninterruptable power supply unit. In another example, the rack assembly includes a device arranged on the self, the device having a connection that blind mates with a given one of the blind mating connections of the set of blind mating connections of the PDB, and the rack, main bus bar, and shelf are configured to allow the power and data to flow from the main bus bar to the PDB and to the device on the shelf. In yet another example, the rack includes a first side wall having a first inner surface, a first end, and a second end opposite of the second end; the main bus bar is located at the second end of the rack adjacent to the first inner surface; and the shelf further includes a first end, a second end opposite of the first end, and a power and data bus (PDB) at the second end of the shelf, the PDB being configured to mate with the main bus bar to allow the power and data to flow between the PDB and the main bus bar when the shelf is placed in the rack such that the first end of the shelf is oriented towards the first end of the rack and the second end of the shelf is oriented towards the second end of the rack, the PDB including a set of blind mating connections for mating with at least one of the one or more computing devices.

A further aspect of the disclosure provides a shelf for housing, supporting, and providing power and data to one or more computing devices in a rack. The shelf includes a surface configured to hold the one or more computing devices. The shelf also includes a power and data bus (PDB) associated with the shelf, the PDB having a blade configured to mate with a main bus bar of the rack to allow the power and data to flow between the PDB and the main bus bar when the shelf is placed in the rack, the PDB further having a set of blind mating connections for allowing power and data to flow to and from a device placed on the shelf.

In one example, the blade is mounted to the PDB at a right angle to a surface of the PDB. In another example, the shelf also includes at least one barrier dividing the shelf into bays for receiving the one or more devices and a spring latch configured to secure a computing device to one of the bays of the shelf.

BRIEF DESCRIPTION OF THE DRAWINGS

FIGS. 3A-3B are system diagrams in accordance with aspects of the disclosure.

DETAILED DESCRIPTION

Figure 1A:
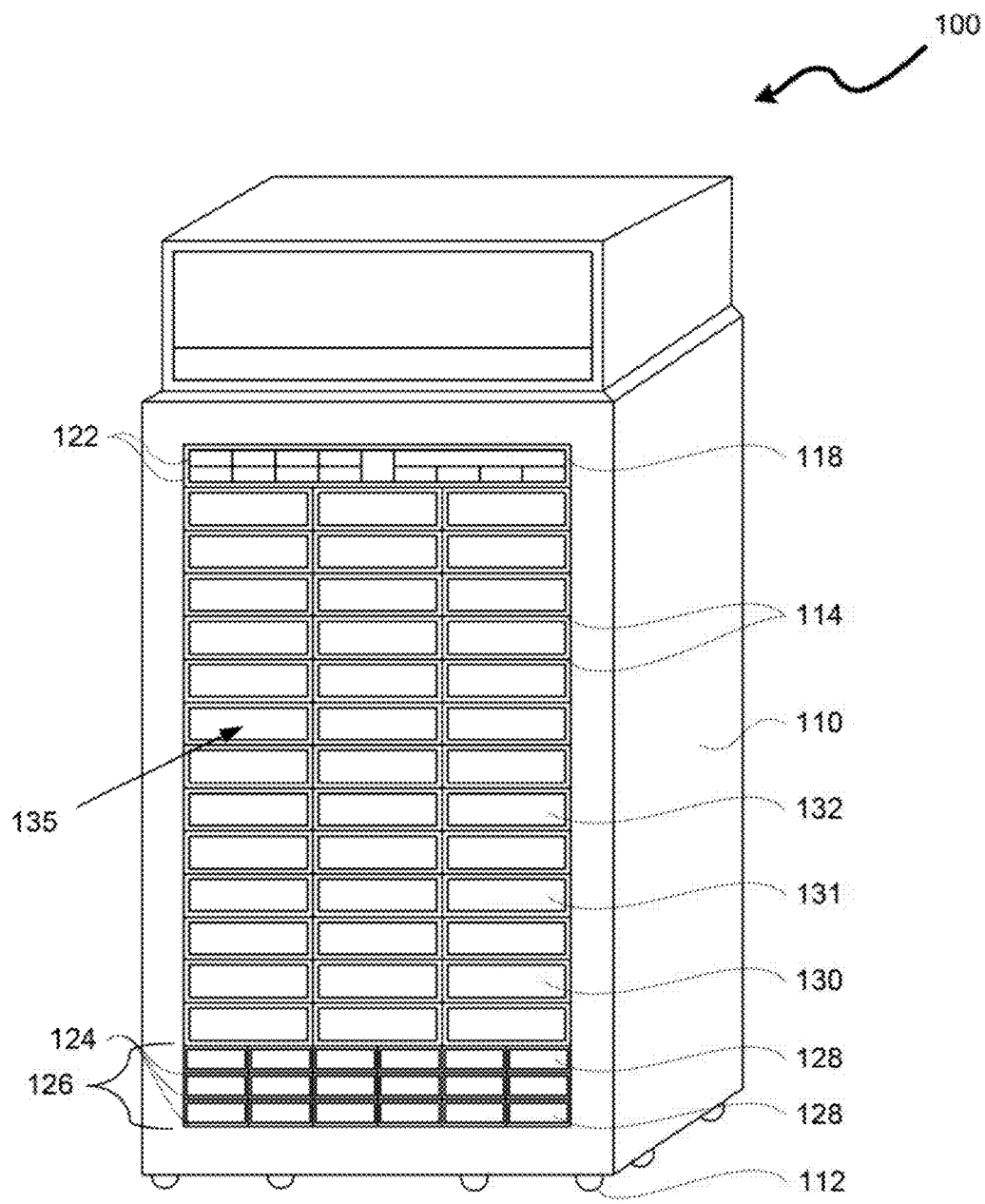
FIGS. 1A-1B are example diagrams of rack architectures in accordance with aspects of the disclosure.
Figure 1B:
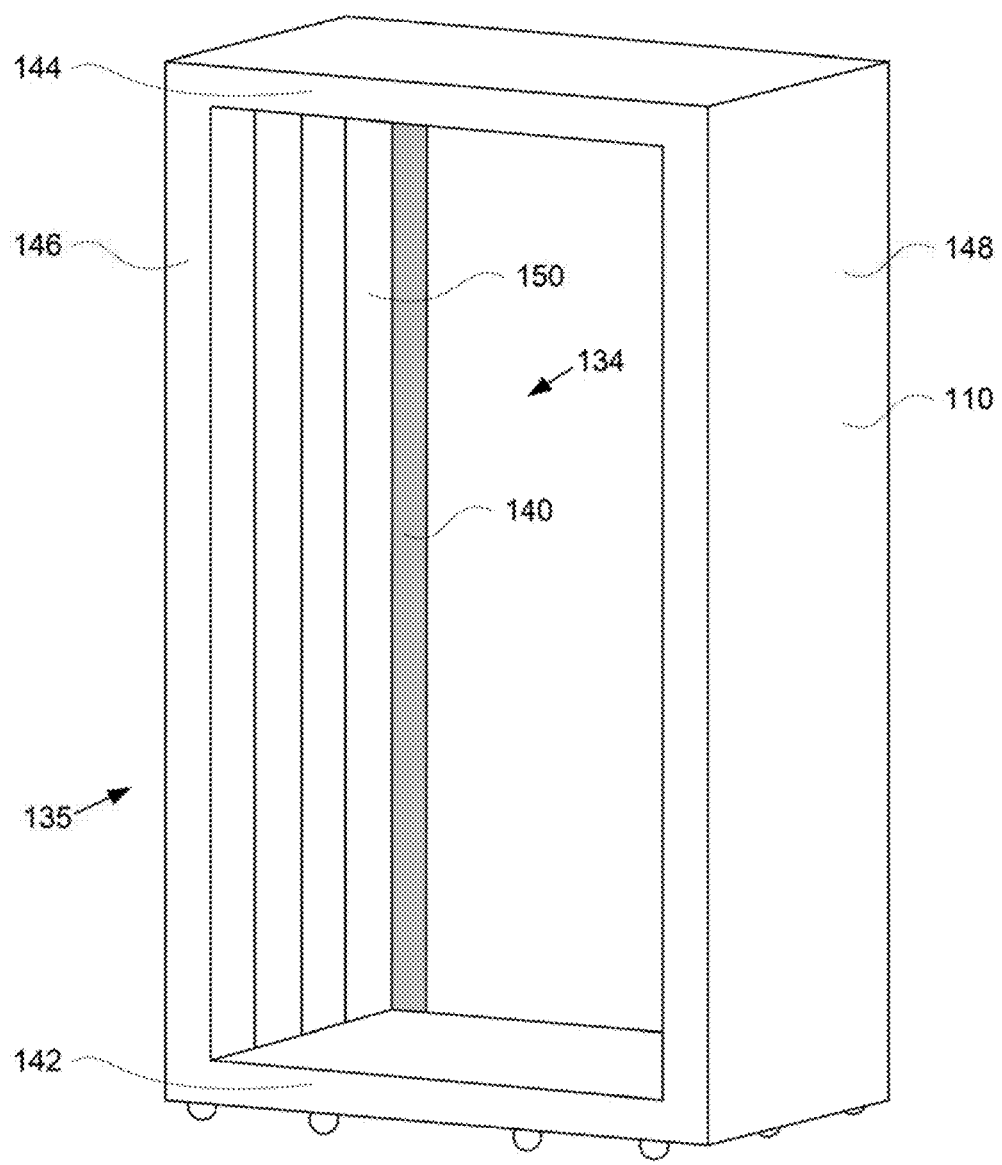

FIGS. 1A and 1B are examples of a mobile rack system in accordance with aspects described herein. FIG. 1A depicts a server system 100 that may include a mobile rack 110 having wheels 112, a plurality of removable shelves 114 for housing and supporting a plurality of computing components 130, a rack monitoring unit (RMU) 118 for monitoring the status of the features of the rack, a plurality of rectifiers 122, and a plurality of removable shelves 124 for housing and supporting a battery backup 126 including uninterruptable power supply units ("UPS units") 128.

FIG. 1B is an example of rack 110 of FIG. 1A without shelves 114 or 124. As shown in FIG. 1B, the rack 110 includes a front end 135 at which the computing components and shelves may be placed in and removed from the rack. Opposite of the front end is a back end 134. Between the front end 135 and back end 134, is a bottom wall 142 and a top wall 144 opposite of the bottom wall. Between the bottom wall 142 and the top wall 144 are two sidewalls 146 and 148. Each of the sidewalls includes an inner side surface 150 (only one shown). These inner sidewalls may be removable or configurable walls that allow systems with different heights and configurations to be installed in the rack. For example, a given shelf may be configured to receive computing components of one height and another shelf may be configured to receive computing components of a different height. In FIG. 1B, it can also be seen that the rack 100 includes a main bus bar 140 adjacent to one inner sidewall 150 at the back end 134 of the rack 110. Although depicted at the back end of the rack 134, the main bus bar may be positioned at various locations in the rack.

The server system 100 supplies power from a power source to the computing components. For example, though not shown in the figures, each of the shelves of the rack may be connected to a power supply, such as an AC or DC power source, by way of main bus bar 140. As described in more detail below, the main bus bar 140 may also be connected to each shelf of the rack in order to provide power to the computing components or battery boxes.

Figure 2:
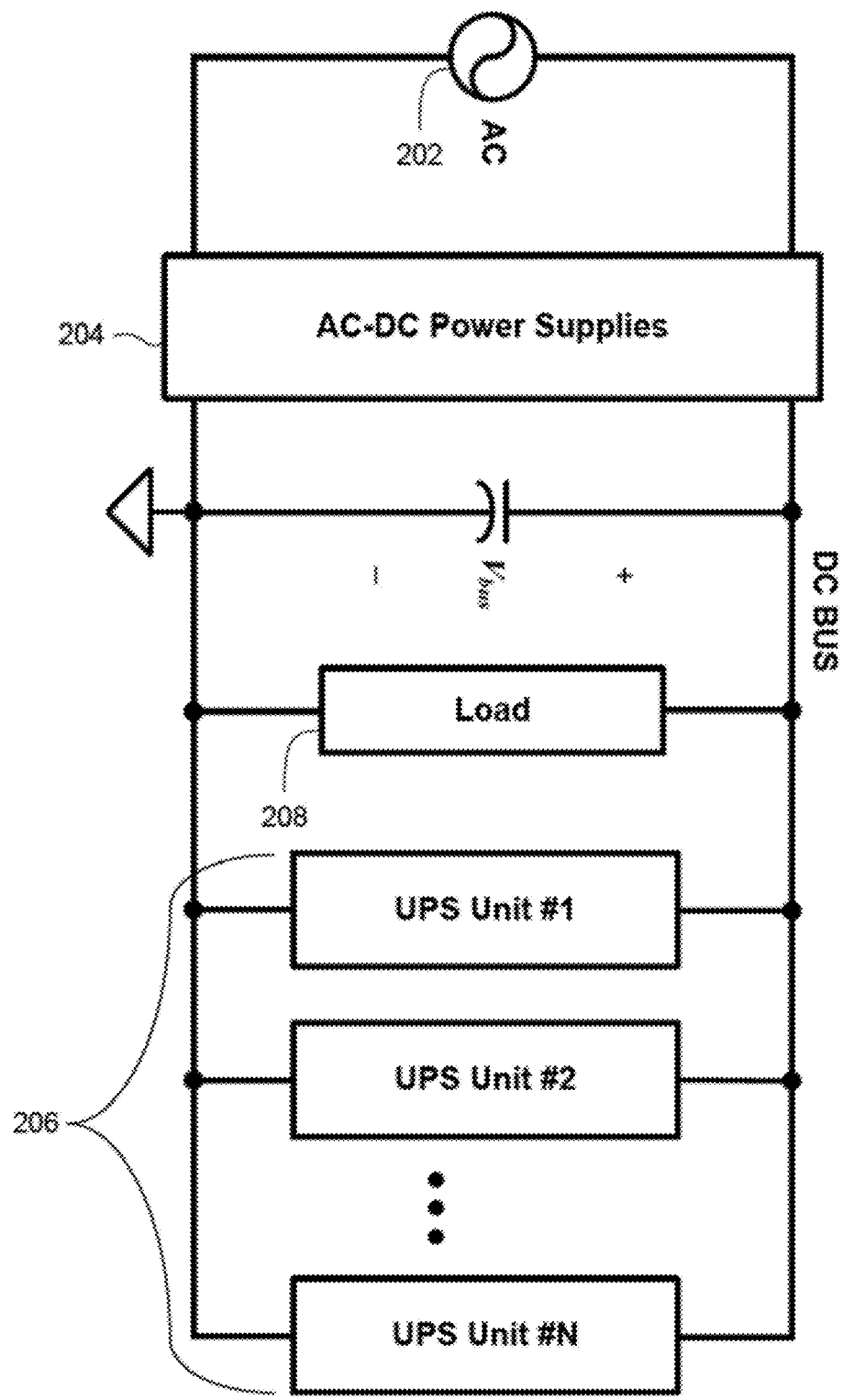
FIG. 2 is an example diagram of power architecture in accordance with aspects of the disclosure.

FIG. 2 is an example of a power architecture for the server system 100. An AC power source 202 may be connected to the rectifiers 124. In this example, the rectifiers 124 may include 48 volt AC to DC rectifiers 204. The rectifiers are connected to the main bus bar 140 and supply power to a load 208 (including components 130-132 of FIG. 1A). The load 208 is connected in parallel to a plurality of UPS 128 which make up the battery supply 126.

Figure 3B:
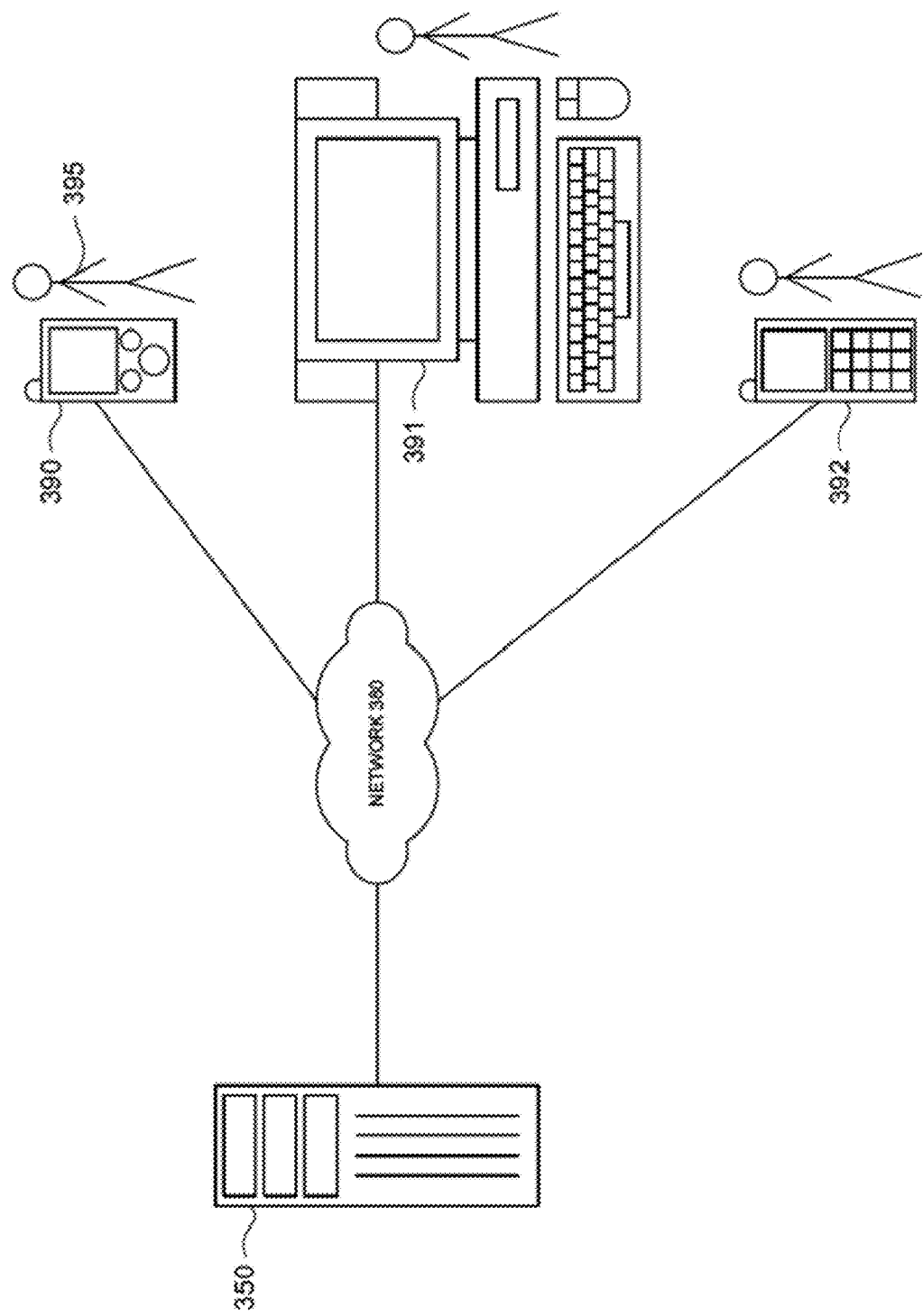

As described above, the load 208 may include a plurality of components. Returning to FIG. 1A, the shelves 114 of rack 110 may receive components 130-132. In one example, component 130 may be a dedicated storage device, for example, including any type of memory capable of storing information accessible by a processor, such as a hard-drive, memory card, ROM, RAM, DVD, CD-ROM, or solid state memory. In another example, component 131 may be a preprogrammed load which draws power from the main bus bar in order to test the operation of the system 100. In yet another example, shown in FIG. 3A, component 132 may be a computer including a processor 330, memory 340 and other components typically present in general purpose computers. In a further example, component 130 or 131 may include a computer configured similarly to computer 132, having a processor, memory, and instructions, or may be a dedicated memory. In this regard, rack 110 and components 130-132, may actually comprise part or all of a load balanced server array 350 of FIG. 3B.

Server array 350 may be at one node of a network 380 and capable of directly and indirectly communicating with other nodes of the network. For example, these computers may exchange information with different nodes of a network for the purpose of receiving, processing and transmitting data to one or more client devices 390-92 via network 380. In this regard, server array 350 may transmit information for display to user 395 on display of client device 390. In this instance, the client devices will typically still be at different nodes of the network than any of the computers, memories, and other devices comprising server array 350.

Figure 4A:
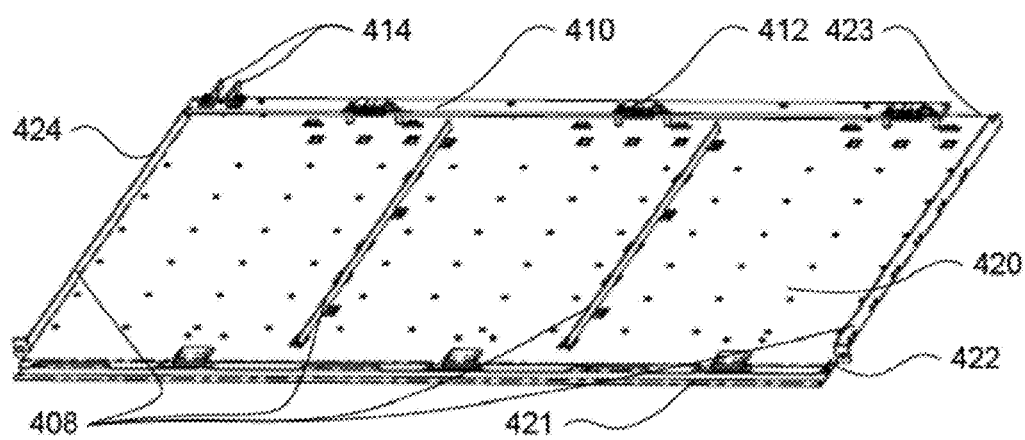
FIGS. 4A-4B are example diagrams of a shelf in accordance with aspects of the disclosure.
Figure 4B:
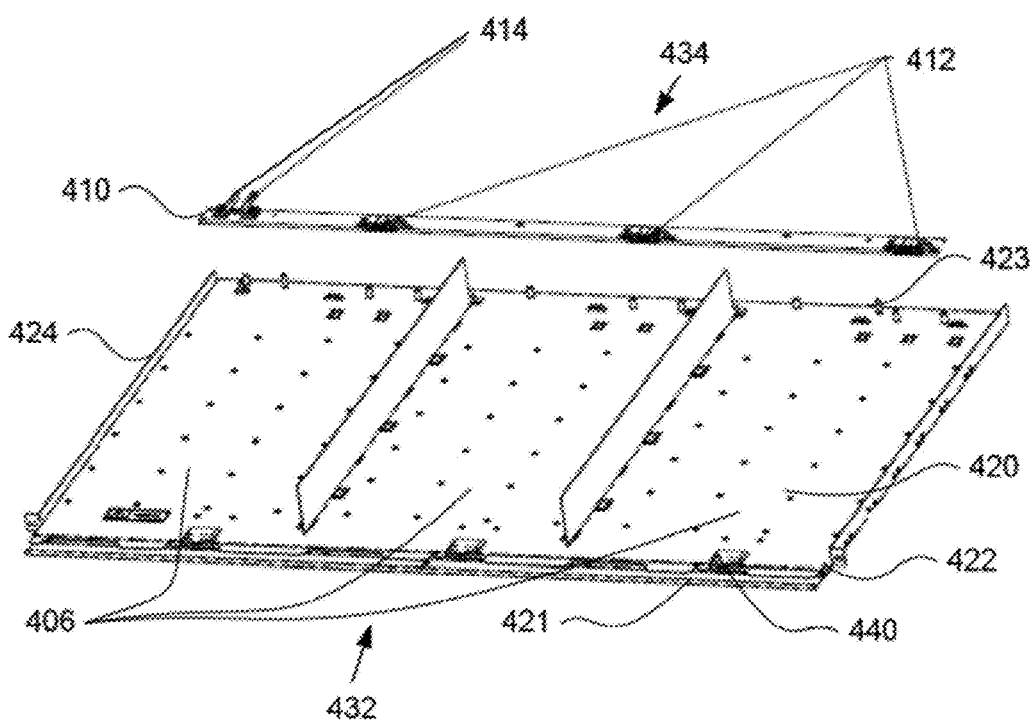

The rack 110 may include a plurality of removable shelves 114 and/or 124. FIG. 4A is an example of shelf 114. Shelf 114 includes a plurality of bays 406 (see FIG. 4B) for receiving the computing components described above. The bays may be divided physically by barriers 408 of different sizes and configurations (compare FIG. 4A with FIGS. 4B, 8A, and 8B) that define the size and shape of the bays. The shelf also includes a power and data bus ("PDB") 410. FIG. 4B is a breakout view of shelf 114 and the PDB 410. The PDB includes a plurality of blind mating connections 412 as well as blades 414.

In the examples of FIGS. 4A and 4B, shelf 114 has a generally rectangular shape. This generally rectangular shape is bounded by four edges 421-424 that surround the surface 420 of the shelf 114. The barriers 408 divide surface 420 to form the bays 406. Shelf 114 includes a front end 432 and a back end 434 opposite of the front end. When placed into the rack 110, the front end 430 is oriented towards the front end 135 of rack 110, and the back end 434 is oriented towards the back end 134 of the rack 110 (see FIG. 6). In this example, the PDB 410 is located along the third edge 423 at the back end 434 of the shelf 114.

The number of computing components which may receive data and/or power from the PDB may be limited by the number of blind mating connections for a particular PDB. In some examples, additional devices may be placed on the shelf and connected to another computing component for power and/or data, rather than the PDB. In the examples of FIGS. 4A and 4B, the PDB 410 includes 3 blind mating connections 412

Figure 5A:
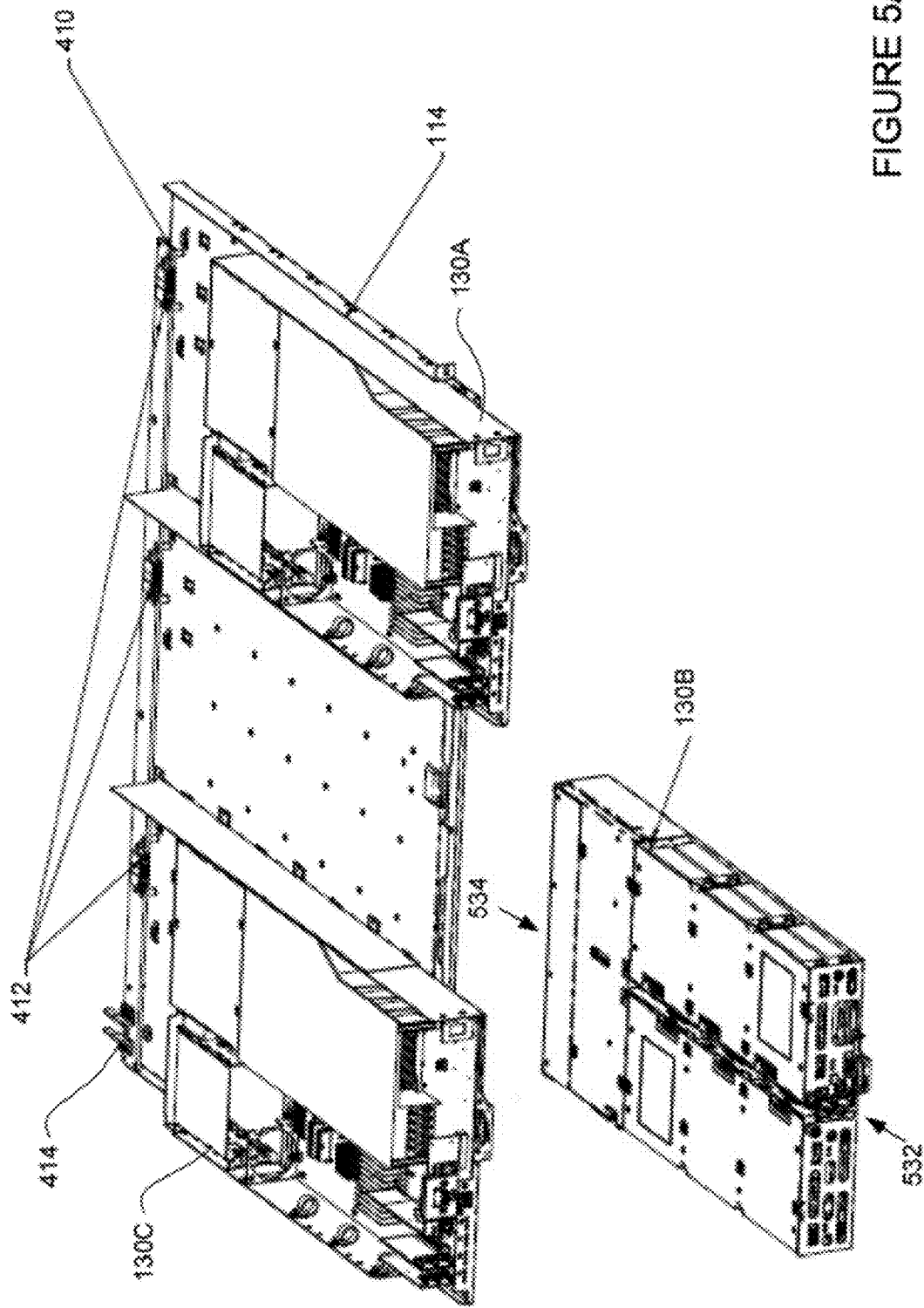
FIGS. 5A-5B are example diagrams of a shelf and computing components in accordance with aspects of the disclosure.

(all identified in FIG. 4B), one for each of the bays 406. Thus, with regard to the example of shelf 114, the maximum number of computing components which may mate with the PDB of shelf 114 at the same time is 3. For example, as shown in FIG. 5A, shelf 114 may fit 3 computing components, namely computing components 130A, 130B, and 130C. In this example, devices 130A-C are in the process of being placed on or removed from shelf 114 and are not fully connected to the PDB 410.

Each computing component includes a front end 532 and a back end 534. When placed on a shelf, such as shelf 114 of FIGS. 4A and 4B, the front end 530 is oriented towards the front end 430 of the shelf 114, and the back end 534 is oriented towards the back end 434 of the shelf 114 and the PDB 410. This allows the terminals of the computing component to mate with the blind mating connections 412 of the shelf 114.

A user may easily attach a computing component to a PDB 410 by placing the computing component on a bay 406 of the shelf 114 and pushing the computing component towards the PBD 410 (and the back end 134 of the rack 110) and along the surface 420 of the shelf. In some examples, the shelves may include a spring latch 440 that secures each computing component on the shelf and against the PDB. When the computing device is being installed, the computing device slides over the latch. The weight of the computing compresses the spring until the housing of the device passes the latch. At this point, the spring decompresses and secures the computing component to the shelf.

A computing component may be detached by pulling the computing component along the surface 420 away from the PDB 410 and towards the front end 132 of the rack. If the shelf includes a spring latch 440, before removing the computing device, a user may first press down or otherwise disconnect the latch 440 and subsequently slide the computing device over the latch and out of the rack.

Figure 5B:
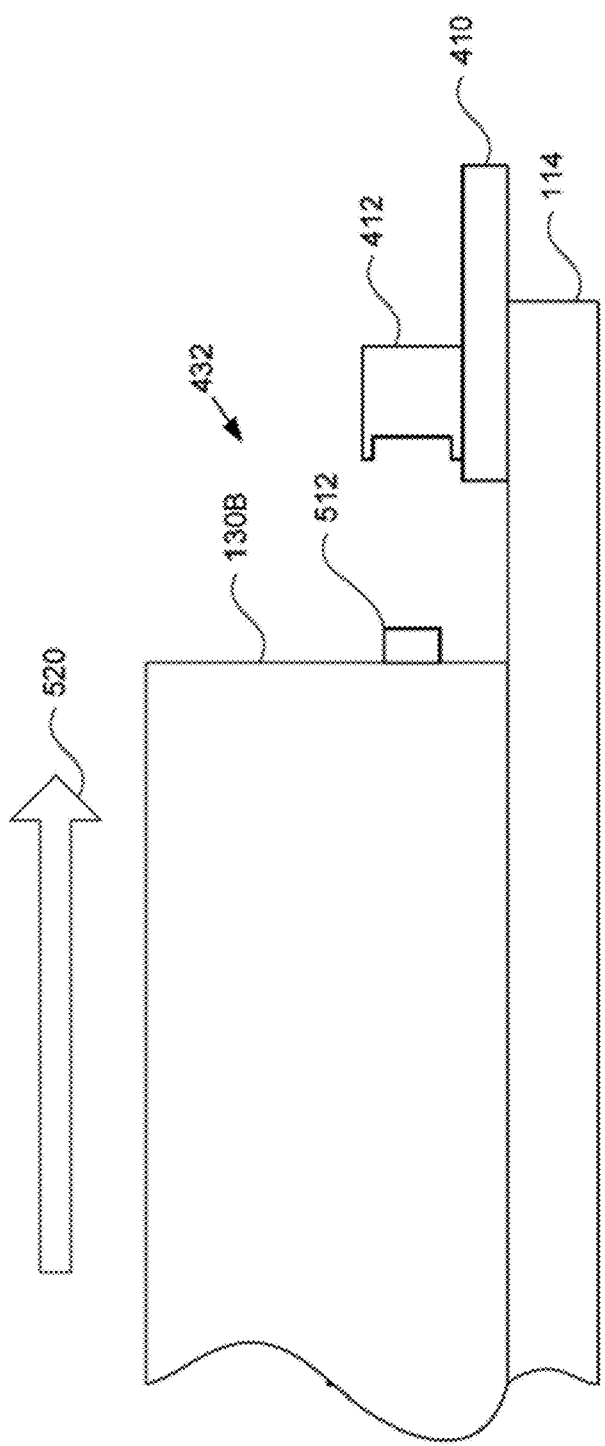

For example, FIG. 5B depicts an example of the back end of computing component 130B being connected to a blind mating connection 412 or the PDB 410 of shelf 114. The terminal connectors 512 of the computing component 130B are lined up laterally with the blind mating connection 412. The computing component 130B is moved towards the PDB 410 in the direction of arrow 520. The barriers 408 may assist in this effort by restricting the lateral movements of the computing component 130B when the computing component 130B is placed between (or along side in the case of computing components 130A or 130C) the barriers. The terminal connectors 512 may also be lined up with the blind mating connection 412 vertically when the computing component is placed on surface 420 of the shelf 114.

Returning to FIGS. 4A and 4B, the PDB may also include blades 414 for connecting to the main bus bar. The blades may include two copper blades. The blades may be relatively thin, but should be of sufficient thickness to carry the required current for the computing devices. Increasing the height of the blades increases the amount of current that can pass from the bus bar to the PDB. The blades may be mounted to the PDB 410 at the back end 434 of the shelf adjacent to edge 424 (as shown in FIGS. 4A, 4B, and 5A) or adjacent to edge 422 (not shown). The blades may be fixed parallel to the PDB 410 and protrude past the PDB 410 and the edge 423 at back end 434 of the shelf 114. The blades may also include guide pins that accurately locate the blades on the PDB.

Figure 6:
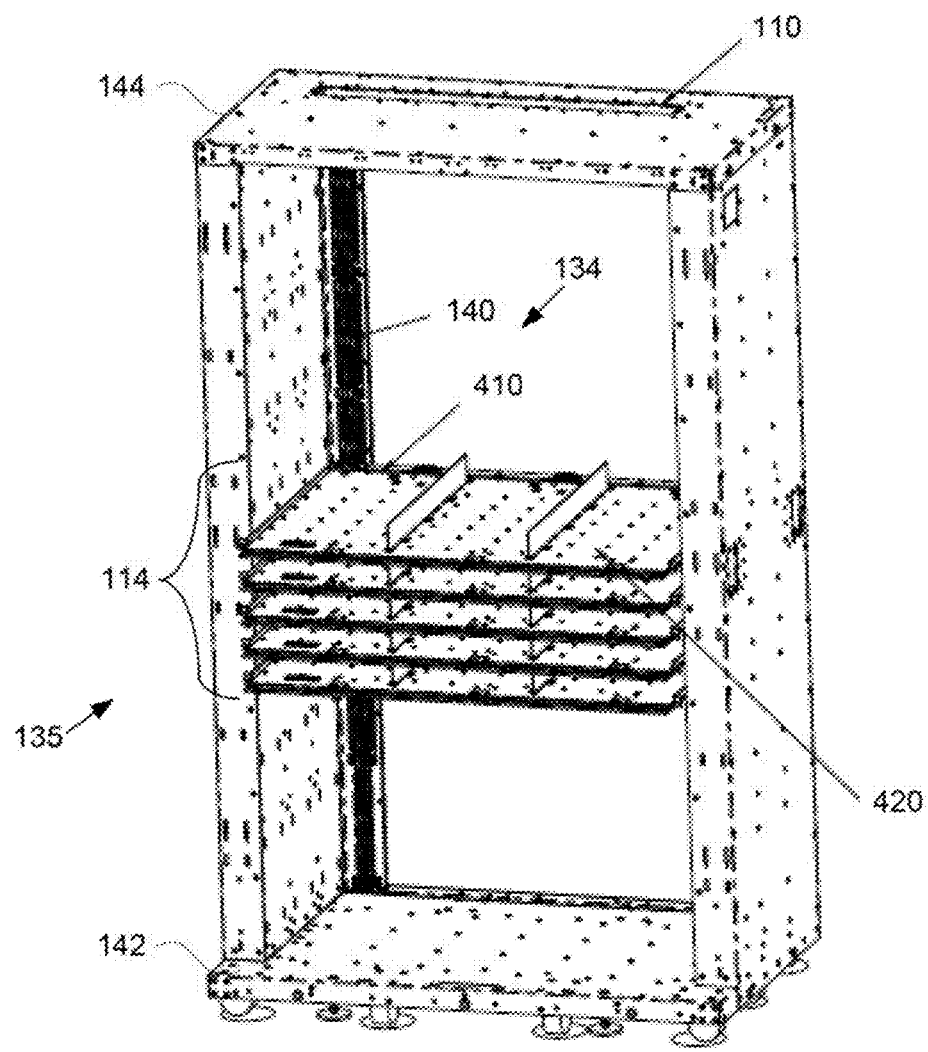
FIG. 6 is an example diagram of a rack in accordance with aspects of the disclosure.

This configuration of the PDB 410 may allow the blades to blind mate with the main bus bar 140 when the shelf 114 is placed in the rack 110. For example, as shown in FIG. 6, when shelves 114 are placed into the rack 110, the front ends 430 are oriented towards the front end 135 of rack 110, and the back ends 432 are oriented towards the back end 134 of the rack 110.

The PDB may have various configurations depending upon the needs of the rack and/or components. For example, the PDB may be positioned at a different location on the shelf. This may be useful where the main bus bar is not located at the back end of the rack (as shown in FIG. 1B). Similarly, the blades of the PDB may be positioned at a different location from those shown in FIGS. 4A and 4B. This may again be useful where the main bus bar is not located at the corner of a rack (as shown in FIG. 1B). Thus, the location of the PDB and blades may be dependent upon the location of the main bus bar with regard to the rack. In another example, referring to FIGS. 4A and 4B, if shelf 114 is approximately 40 inches wide and 0.5 to 1.0 inches thick, the PDB may be approximately 40 inches long and 1.5 inches wide. The thickness and depth of the shelf may depend upon the weight of the computing components the shelf needs to support. In addition, the shelf may be made of riveted pieces of steel while the PDB may be composed of epoxy resin prepeg with copper layers and traces.

Figure 7B:
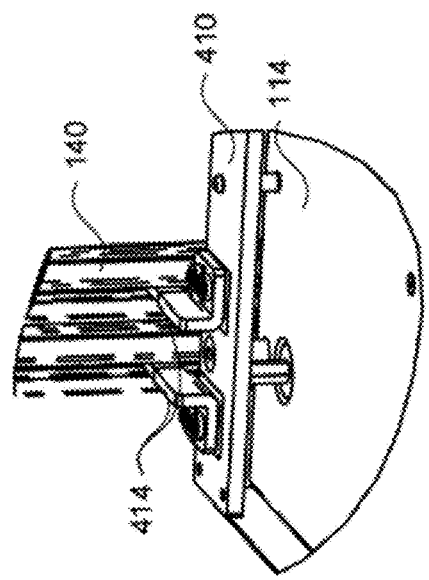
FIGS. 7A-7B are example diagrams of a shelf and a bus bar in accordance with aspects of the disclosure.
Figure 7A:
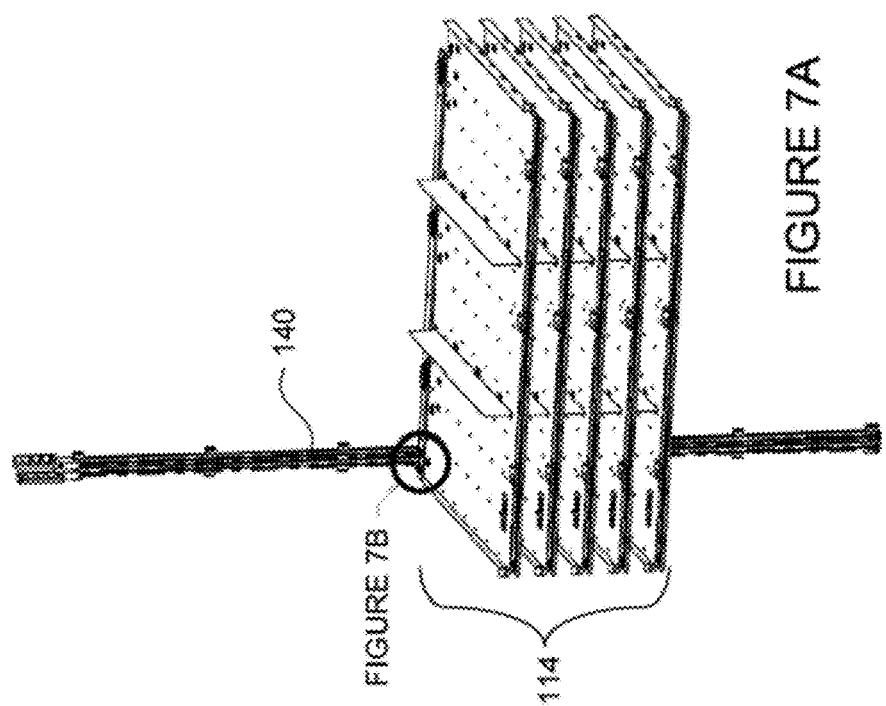

As described above, the main bus bar 140 may be used to provide power and data to the components of the rack 110. FIG. 7A is a depiction of the main bus bar 140 and shelves 114 without the rack 114. FIG. 7B is a partial view of the main bus bar 140 where it connects to a PDB 410 of a shelf 114. As can be seen in this figure, the blades 414 mate with the main bus bar 140 when the shelf 114 is placed in the rack. This connection allows power to flow between the PDB and the main bus bar. The blades then transfer power from the main bus bar 140 to the PDB 410. Referring to FIGS. 4A and 4B, the power from the PDB may then flow through the blind mating connections 412. When the terminals 512 of a computing component mate with the blind mating connections 412, the power from the bus bar may flow to the computing component.

Figure 8A:
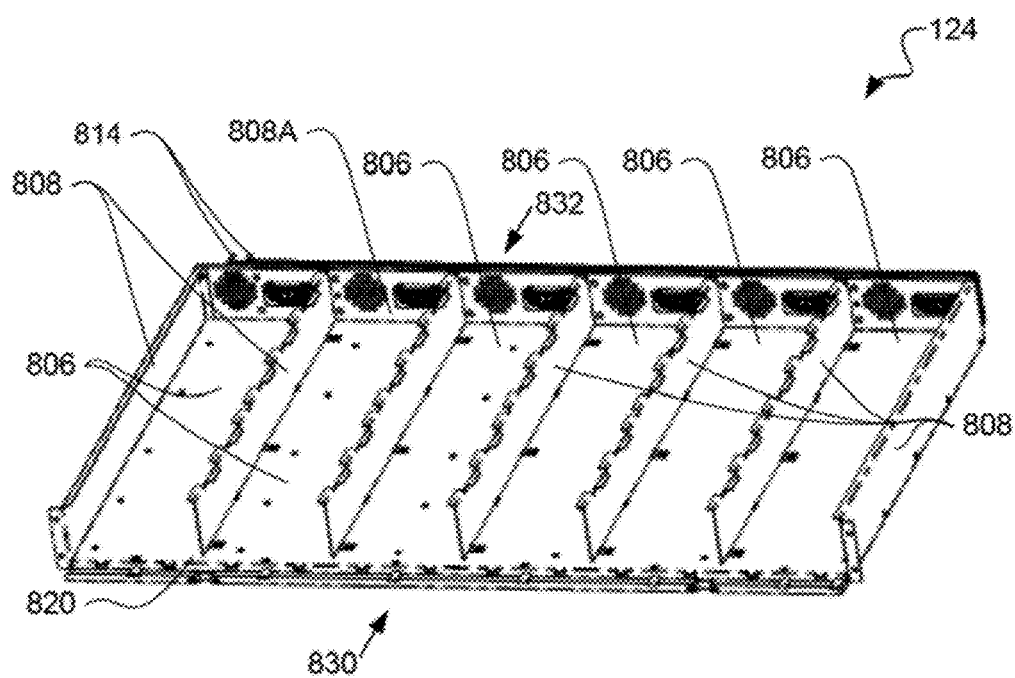
FIGS. 8A-8B are example diagrams of a shelf in accordance with aspects of the disclosure.
Figure 8B:
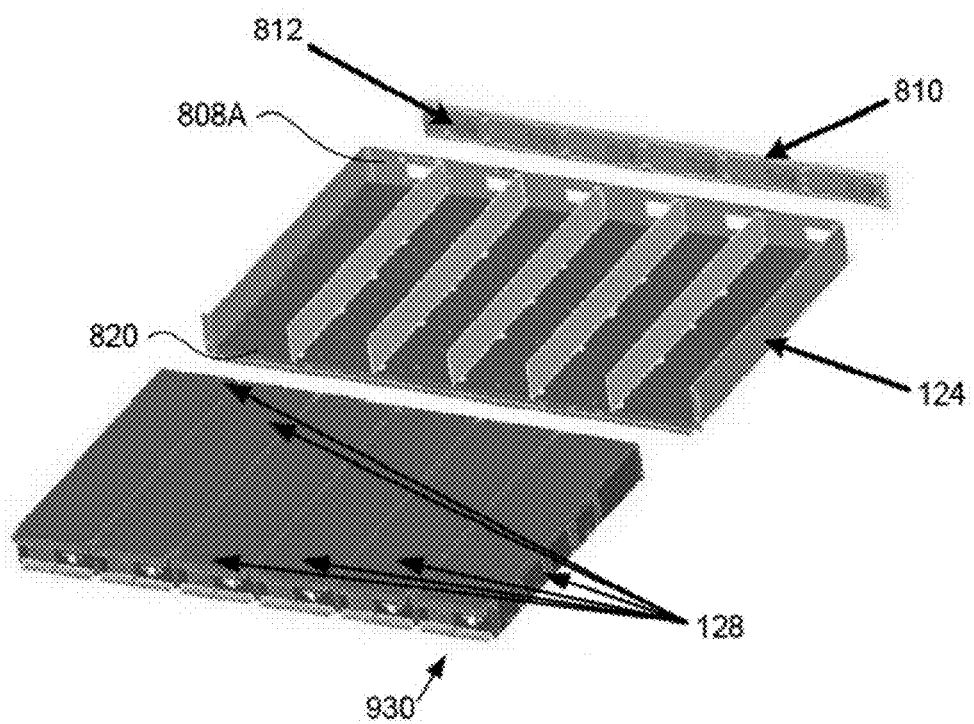

In addition to or instead of shelves 114 configured to support components, the rack may include shelves configured to support UPS units of battery backup 126. Thus, in some examples, the rack may be wholly comprised of computing components, storage components, or UPS units or any combination of these features. FIG. 8A depicts an example of a shelf 124 without any UPS units. Similar to shelf 114, shelf 124 includes a plurality of bays 806 for receiving the computing components described above. The bays may be divided physically by barriers 808 of different sizes and configurations that define the size and shape of the bays. The shelf also includes a battery power and data bus ("battery bus bar") 810. FIG. 8B is a breakout view of shelf 124, UPS units 128, and the battery PBD 812. Like PDB 410, the battery bus bar 810 includes a plurality of blind mating connections 812 as well as blades 814.

Again, like shelf 114, shelf 124 may include a generally rectangular shape. This generally rectangular shape is bounded by four edges that surround the surface 820 of the shelf 124. The barriers 808 divide surface 820 to form the bays 806. At the back end 832, the bays are bounded by a barrier 808A positioned between the bays and the battery PDB 810. In this example, the shelf includes 6 bays whereas the example of FIG. 4A includes 3 bays. Thus, with regard to the example of shelf 124, the maximum number of UPS units which may mate with the battery bus bar of shelf 124 at the same time is 6.

Shelf 124 also includes a front end 830 opposite of the back end 832. As with shelf 114, when placed into the rack 110, the front end 830 of shelf 124 is oriented towards the front end 135 of rack 110, and the back end 832 is oriented towards the back end 134 of the rack 110. In this example, the battery bus bar 810 is located along the third edge 824 at the back end 832 of the shelf 124.

Figure 9:
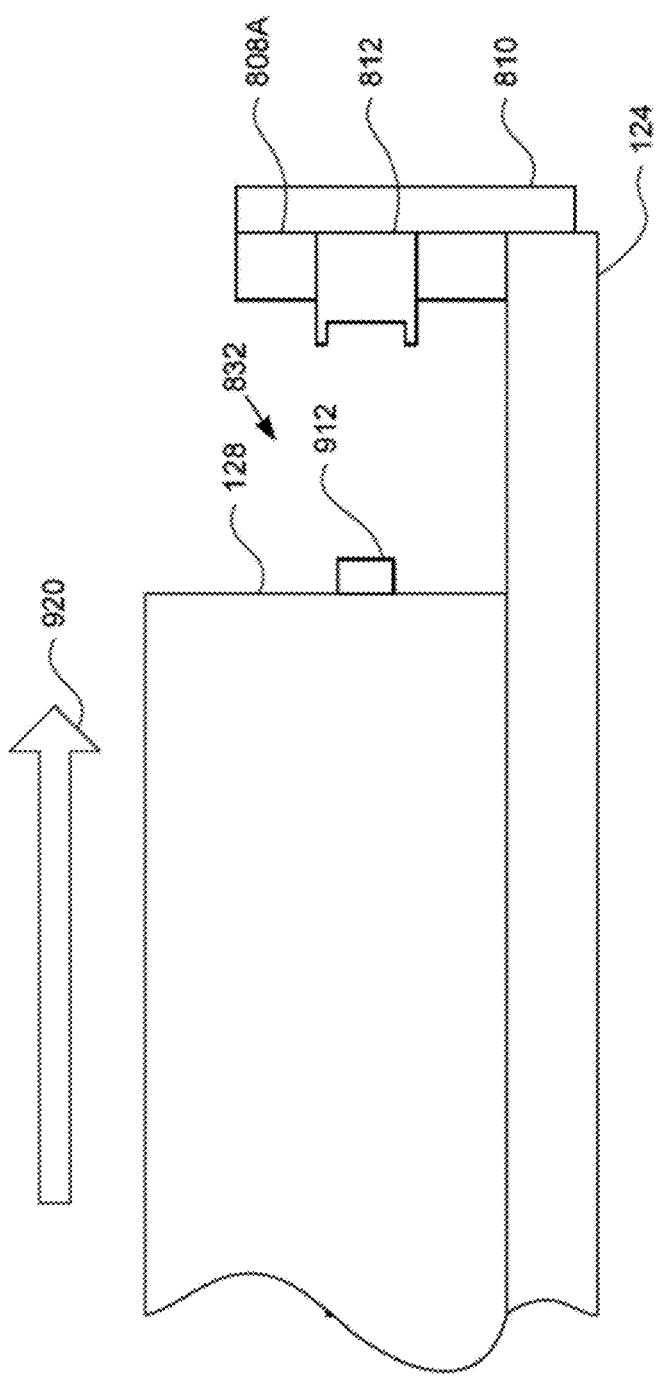
FIG. 9 is an example diagrams of a shelf and an uninterruptable power supply unit in accordance with aspects of the disclosure.

When a UPS unit is placed on the shelf 128, like the computing components described above, the front end 930 (shown in FIG. 8) of the UPS unit is oriented towards the front end 830 of the shelf 124, and the back end 932 (shown in FIG. 9) of the UPS unit is oriented towards the back end 832 of the shelf 124 and the battery bus bar 810. The terminals 912 of the UPS unit are located at the back end of the UPS unit as shown in FIG. 9. This allows the terminals of the UPS unit to mate with the blind mating connections 812 of the shelf 124.

Like the computing components devices above, a user may easily attach a UPS unit to battery bus bar 810 by placing the UPS unit on a bay 806 of the shelf 124 and pushing the UPS unit towards the battery PBD 810 (and the back end 134 of the rack 110) and along the surface 820 of the shelf. As with the shelf 114 above, shelf 124 may also include a tool-less retention device, such as a spring latch, to secure the UPS unit to the shelf. A UPS unit may be detached by pulling the UPS unit along the surface 820 away from the battery bus bar 810 and towards the front end 135 of the rack.

FIG. 9 depicts an example of the back end 832 of a UPS unit 128 being connected to a blind mating connection 812 or the battery bus bar 810 of shelf 124. The terminal connectors 912 of the UPS unit 128 are lined up laterally with the blind mating connection 812. The UPS unit 128 is moved towards the PDB 810 in the direction of arrow 920. The barriers 808 may assist in this effort by restricting the lateral movements of the UPS unit 128 when the UPS unit 128 is placed between the barriers. The terminal connectors 812 may also be lined up with the blind mating connection 812 vertically when the UPS unit 128 is placed on surface 820 of the shelf 124.

Returning to FIGS. 8A and 8B, the battery bus bar may also include blades 814 for connecting to the main bus bar. The blades 814 may be configured similarly to blades 412 of PDB 410. For example, the blades 814 may be mounted to the battery bus bar 810 at the back end 832 of the shelf. The blades 814 may be arranged orthogonally or at a right angle to the battery bus bar 810 and protrude past the battery bus bar 810 and the back end 832 of the shelf 124. In one example, the blades may be formed by attaching them to the battery bus bar. In another example, the battery bus bar may comprise two copper plates running parallel to one another. In this example, the blades may not be separate components mounted to the battery bus bar, but formed by bending the copper plates to form a right angle. This configuration reduces the voltage drop between the battery bus bar and the blades as there is no connection interface between them.

The main bus bar 140 may be used to provide power and data to the UPS units. Similar to the example depicted in FIGS. 7A and 7B, the blades 814 mate with the main bus bar 140 when the shelf 124 is placed in the rack. This connection allows power and data to flow between the battery bus bar and the main bus bar. The blades 814 then transfer power between the main bus bar 140 to the battery bus bar 810. The power may then also flow between the battery bus bar 810 and the blind mating connections 812. When the terminals 912 of a UPS unit 128 mate with the blind mating connections 812, power may also flow between the blind mating connections and the UPS unit.

In order to increase the maximum number of computing components or UPS units on a shelf or to change the arrangement of a particular shelf, the PDB may be removed from the shelf and replaced, or a new shelf with a different PDB arrangement may be use. For example the new shelf and PDB may be configured to accept and mate with computing components of a different configuration, for example, size, shape, arrangement of terminals, etc.

Shelves 114 and 124 are used herein to describe example configurations. As noted above, various other configurations may also be used. For example, the configuration of shelf 124 may be used to house and support computing components and the configuration of shelf 114 may be used to house and support UPS units. Similarly, the shelves can be configured to receive different numbers of computing devices or UPS units.

The racks and shelves described herein may be provided as a kit. This may allow a single rack to be modified in order to support new technologies and device configurations without great expense or effort.

In addition, the user of the configurations and features described herein may simplify the power and/or data routing in a rack system. For example, by using a PDB or battery bus bar, the number of cables required to transfer power and/or data to the computing devices or UPS units may be reduced. This also simplifies the attachment and removal of computing components and UPS units from the rack. For example, if a blind mating connector for a particular PDB has been damaged, the shelf may be removed, a new PDB installed, and the shelf replaced back into the rack without disturbing operation of the other devices of the rack.

As these and other variations and combinations of the features discussed above can be utilized without departing from the subject matter defined by the claims, the foregoing description of the implementations should be taken by way of illustration rather than by way of limitation of the subject matter defined by the claims. It will also be understood that the provision of the examples disclosed herein (as well as clauses phrased as "such as," "including" and the like) should not be interpreted as limiting the claimed subject matter to the specific examples; rather, the examples are intended to illustrate only one of many possible implementations. Further, the same reference numbers in different drawings may identify the same or similar elements.

The invention claimed is:

1. A kit adapted for assembly into a plurality of different rack configurations, the kit comprising:
   a rack;
   a main bus bar; and
   a plurality of interchangeable shelves including:
   a first shelf configured to receive at least a first device and a second device, the first shelf having a first bus for providing one or more of power or data to the first device and the second device from the main bus bar, the first bus being configured to mate with the main bus bar upon insertion of the first shelf in the rack, the first bus further having a first set of blind mating connections for mating with the first device and the second device, the first shelf further having two or more first bays, wherein one of the two or more first bays is configured to guide the first device into the first shelf such that the first device lines up with a first blind mating connection of the first set of blind mating connections, and wherein another of the two or more first bays is configured to guide the second device into the first shelf such that the second device lines up with a second blind mating connection of the first set of blind mating connections;
   wherein the first shelf includes a first barrier that divides the first shelf into the two or more first bays for receiving either of the first device or the second device, the first barrier having a height that defines the size and shape of the two or more first bays, the first barrier selected from barriers having different heights; the first shelf further including a second barrier, the second barrier having a height less than the height of the first barrier, the first barrier and the second barrier defining at least one of the two or more first bays.

2. The kit of claim 1, wherein the first bus includes a first blade for mating with the main bus bar when the first shelf is placed in the rack.

3. The kit of claim 2, wherein the first blade is mounted to the first bus at a right angle to a surface of the first bus.

4. The kit of claim 1, wherein the first shelf includes a spring latch configured to secure the first device to one of the two or more first bays of the first shelf.

5. The kit of claim 1, wherein the first bus is configured to mate with at least one uninterruptable power supply unit such that power flows between the main bus bar and the uninterruptable power supply unit when the rack is powered.

6. The kit of claim 1, wherein:
the rack includes a first side wall having a first inner surface, a first rack end, and a second rack end opposite of the first rack end;
the main bus bar is located at the second rack end of the rack adjacent to the first inner surface; and
the first shelf has a first shelf end, a second shelf end opposite of the first shelf end, and the first bus is located at the second shelf end.

7. The kit of claim 6, wherein when the first bus mates with the main bus bar when the first shelf is placed in the rack such that the first shelf end is oriented towards the first rack end and the second shelf end of the first shelf is oriented towards the second rack end.

8. The kit of claim 1, wherein each of the first bays is configured for receiving the first device, the set of blind mating connections corresponding to a number of the first bays.

9. The kit of claim 1, wherein the first bus is removably attached to the first shelf.

10. The kit of claim 1, wherein the plurality of interchangeable shelves further comprises a second shelf, the second shelf further having a second bus including a second blade for mating with the main bus bar when the second shelf is placed in the rack.

11. The kit of claim 10, wherein the second shelf further has two or more second bays, a number of the second bays being different from a number of the first bays.

12. The kit of claim 1, wherein each of the first and second barriers is monolithic.

13. A rack assembly comprising:
a rack;
a main bus bar;
a first shelf having a first shelf bus, the first shelf bus being configured to blind mate with the main bus bar to allow power to flow between the first shelf bus and the main bus bar when the first shelf is placed in the rack, the first shelf bus including a first set of blind mating connections for mating with a first computing device, the first shelf further having two or more first bays each configured to receive the first computing device and a first spring latch configured to secure the first computing device to the first shelf when the first computing device is mated with the first shelf bus; and
a second shelf having a second shelf bus, the second shelf bus being configured to blind mate with the main bus bar to allow the power to flow between the second shelf bus and the main bus bar when the second shelf is placed in the rack, the second shelf bus including a set of second blind mating connections for mating with a second computing device, the second shelf further having two or more second bays each configured to receive the second computing device and a second spring latch configured to secure the second computing device to the second shelf when the second computing device is mated with the second shelf bus;
wherein the first shelf includes at least a first barrier that divides the first shelf into the two or more first bays for receiving the first computing device and the second shelf includes at least a second barrier that divides the second shelf into the two or more second bays for receiving the second computing device, the first barrier has a height different than the height of the second barrier.

14. The rack assembly of claim 13, wherein the first shelf bus further includes at least one blade for mating with the main bus bar when the first shelf is placed in the rack.

15. The rack assembly of claim 14, wherein the at least one blade is mounted to the first shelf bus in a plane parallel to a surface of the first shelf bus.

16. The rack assembly of claim 13, wherein a number of the two or more first bays corresponds to a number of blind mating connections within the first set of blind mating connections of the first shelf bus.

17. The rack assembly of claim 13, wherein the first bays of the first shelf are configured to guide the first computing device into the first shelf when the first shelf is in the rack.

18. The rack assembly of claim 13, further comprising:
the computing device arranged on the first shelf, the computing device having a connection that blind mates with a given one of the first set of blind mating connections of the first shelf bus; and
wherein the rack, main bus bar, and first shelf are configured to allow the power and data to flow from the main bus bar to the first shelf bus and to the computing device on the first shelf.

19. The rack assembly of claim 13, wherein:
the rack includes a first side wall having a first inner surface, a first rack end, and a second rack end opposite of the first rack end;
the main bus bar is located at the second rack end adjacent to the first inner surface; and
the first shelf further includes a first shelf end, a second shelf end opposite of the first shelf end, and the first shelf bus is positioned at the second shelf end of the first shelf, the first shelf bus being configured to mate with the main bus bar to allow the power to flow between the first shelf bus and the main bus bar when the first shelf is placed in the rack such that the first shelf end of the first shelf is oriented towards the first rack end and the second shelf end is oriented towards the second rack end.

20. A rack assembly comprising:
a rack;
a main bus bar;
a first shelf having a first shelf bus, the first shelf bus being configured to blind mate with the main bus bar to allow power to flow between the first shelf bus and the main bus bar when the first shelf is placed in the rack, the first shelf bus including a first set of blind mating connections for mating with a computing device, the first shelf further having two or more first bays each configured to receive the computing device and a first spring latch configured to secure the computing device to the first shelf when the computing device is mated with the first shelf bus; and
a second shelf having a second shelf bus, the second shelf bus being configured to blind mate with the main bus bar to allow the power to flow between the second shelf bus and the main bus bar when the second shelf is placed in the rack, the second shelf bus including a set of second blind mating connections for mating with a power supply unit, the second shelf further having two or more second bays each configured to receive the power supply unit and a second spring latch configured to secure the power supply unit to the second shelf when the power supply unit is mated with the second shelf bus.

* * * * *